(12) United States Patent
Levisse

(10) Patent No.: US 9,666,243 B2
(45) Date of Patent: May 30, 2017

(54) METHOD AND CIRCUIT FOR CONTROLLING PROGRAMMING CURRENT IN A NON-VOLATILE MEMORY ARRAY

(71) Applicant: Commissariat à l'Énergie Atomique et aux Énergies Alternatives, Paris (FR)

(72) Inventor: Alexandre Levisse, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/288,341

(22) Filed: Oct. 7, 2016

(65) Prior Publication Data

US 2017/0103788 A1   Apr. 13, 2017

(51) Int. Cl.
*G11C 7/10* (2006.01)
*G11C 5/14* (2006.01)
*G11C 11/16* (2006.01)
*H01L 27/22* (2006.01)
*H01L 27/24* (2006.01)
*G11C 13/00* (2006.01)
*G11C 29/02* (2006.01)

(52) U.S. Cl.
CPC .......... *G11C 5/147* (2013.01); *G11C 11/1675* (2013.01); *G11C 11/1697* (2013.01); *G11C 13/0004* (2013.01); *G11C 13/0007* (2013.01); *G11C 13/0038* (2013.01); *G11C 13/0069* (2013.01); *G11C 29/021* (2013.01); *H01L 27/222* (2013.01); *H01L 27/2481* (2013.01); *G11C 2013/0078* (2013.01)

(58) Field of Classification Search
USPC .................. 365/189.06, 189.16, 189.09
See application file for complete search history.

(56) References Cited

U.S. PATENT DOCUMENTS

| 8,866,121 | B2 * | 10/2014 | Wang ................. H01L 45/1233 257/2 |
| 2008/0094929 | A1 * | 4/2008 | Rinerson ............. G11C 13/004 365/208 |
| 2013/0114327 | A1 | 5/2013 | Ikeda et al. |

(Continued)

OTHER PUBLICATIONS

French Search Report, dated Jul. 14, 2016, from related French Application No. 15/59648.

(Continued)

*Primary Examiner* — Vu Le
(74) *Attorney, Agent, or Firm* — Wolf, Greenfield & Sacks, P.C.

(57) ABSTRACT

A memory device having: a cross-point memory array; a current supply circuit adapted to supply a programming current to a selected row line of the array during a programming operation to change the resistive state of a selected memory cell coupled between the selected row line and a selected column line of the array; a leakage current detection circuit coupled to the column lines except the selected column line and adapted to detect leakage currents during the programming operation; and a current limit generation circuit adapted to generate a current limit based on the sum of the leakage currents and on a reference current, and to supply the current limit to the current supply circuit to limit the programming current.

12 Claims, 4 Drawing Sheets

(56) References Cited

U.S. PATENT DOCUMENTS

2013/0148406 A1  6/2013  Shimakawa et al.
2014/0112056 A1  4/2014  Tsuji

OTHER PUBLICATIONS

Lie et al.: "A 130 7-mm$_2$ 2-Layer 32-Gb ReRAM Memory Device in 24-nm Technology," (2014) IEEE Journal of Solid-State Circuits; pp. 140-153.
Baek et al.: "A Reliable Cross-Point MLC RERAMN with Sneak Current Compensation,"(2015) IEEE.
Woo et al.: "Selector Devices for High Intensity Cross-point ReRAM," (2014) Non-Volatile Memory Technology Symposium.

\* cited by examiner

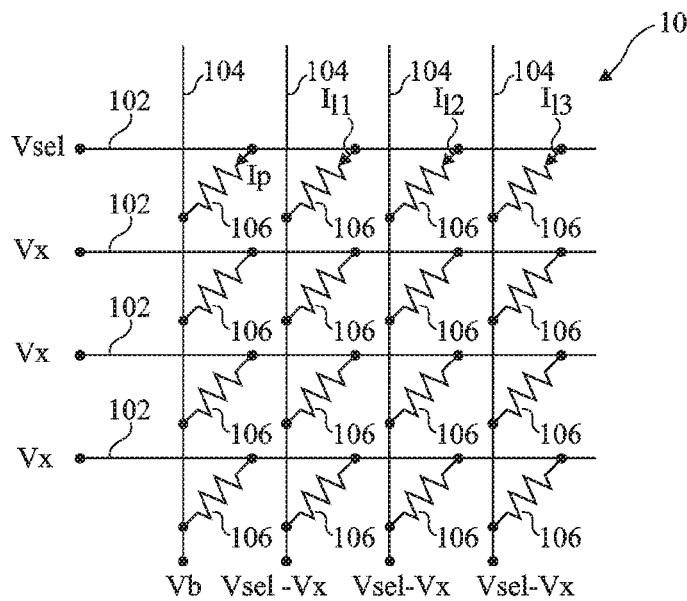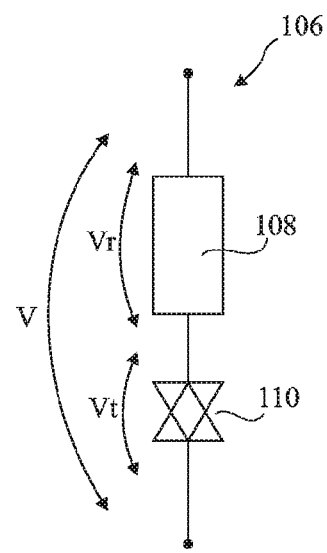
Fig 1A    Fig 1B
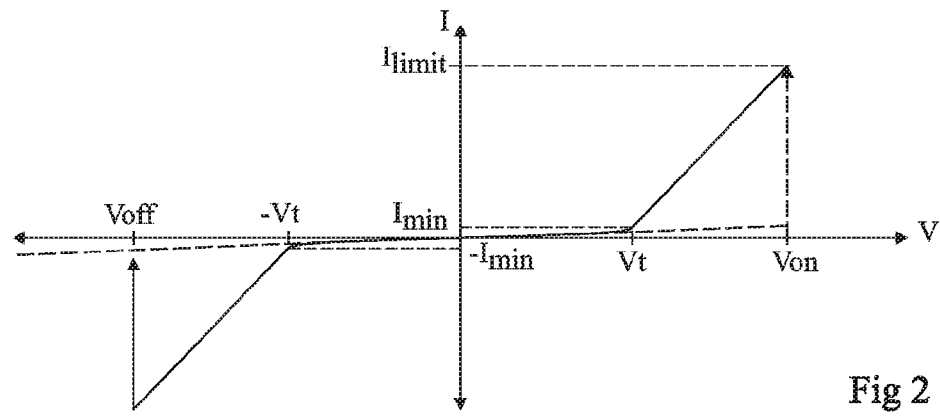
Fig 2
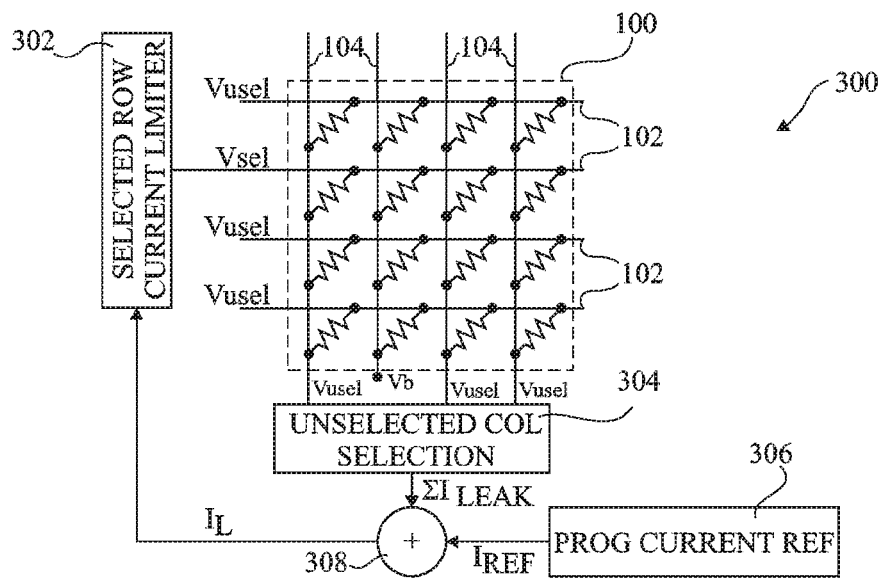
Fig 3

METHOD AND CIRCUIT FOR CONTROLLING PROGRAMMING CURRENT IN A NON-VOLATILE MEMORY ARRAY

CROSS-REFERENCED TO RELATED APPLICATION

This application claims the benefit of French patent application number 15/59648, filed Oct. 9, 2015, the content of which is hereby incorporated by reference in its entirety to the maximum extent allowable by law.

FIELD

The present disclosure relates to the field of non-volatile memories, and in particular to a method and circuit for controlling the programming current of non-volatile memory cells in a cross-point memory array.

BACKGROUND

It has been proposed to use programmable resistive elements in memory cells to provide non-volatile data storage. Such resistive elements are programmable to adopt one of a plurality of different resistive states. The programmed resistive state is maintained when the supply voltage of the memory cell is disconnected, and thus data can be stored in a non-volatile fashion.

Various types of resistive elements have been proposed, some of which are capable of being programmed by the direction and/or level of the current which is passed through them. Examples of such current-programmable resistive elements include OxRAM (Oxide Random Access Memory), PC-RAM (Phase Change Random Access Memory) and MRAM (magnetic RAM) using for example STT (spin-transfer torque) technology.

In order to provide a compact memory array, it has been proposed to incorporate non-volatile memory cells in a cross-point memory array architecture. In such an array, memory cells are arranged in rows and columns, each row having an associated row line, and each column having an associated column line. Each memory cell comprises a programmable resistive element coupled between a corresponding row line and a corresponding column line. Thus by applying particular voltage levels to the column and row lines, a given memory cell in the array can be selected for a read or write operation.

Depending on the particular technology of the non-volatile programmable resistive element, the level of the programming current used during the programming operation may affect a certain property of the programmed resistive state, such as the programmed resistance and/or the data retention duration.

For example, in the case of an OxRAM memory cell, when passing from the high resistive state to the low resistive state, the programming current will rise rapidly, and the level reached by the programming current will determine the programmed resistance level of the cell. Therefore, in order to program a particular desired resistance, the current should be limited during the programming operation.

However, a difficulty in cross-point memory arrays is that, while a given memory cell is being programmed, a certain amount of the current driven into the array will be lost via current leakage through non-selected memory cells. Such current paths are known in the art as sneak paths. The amount of current conducted via sneak paths will depend on various factors, such as the resistive states of the non-selected memory cells, the position of the selected memory cell in the array, the operating conditions, the age of the device and the performance of other components in each memory cell. There is a technical problem in adequately compensating for such leakage currents.

There is thus a need in the art for a circuit and method providing effective current limitation during programming operations in a non-volatile cross-point memory array.

SUMMARY

It is an aim of embodiments of the present disclosure to at least partially address one or more needs in the prior art.

According to one aspect, there is provided a memory device comprising: a cross-point memory array comprising a plurality of row lines, a plurality of column lines and a plurality of memory cells arranged in rows and columns, each memory cell comprising a non-volatile programmable resistive element coupled between a corresponding one of the row lines and a corresponding one of the column lines; a current supply circuit adapted to supply a programming current to a selected one of the row lines during a programming operation to change the resistive state of a selected memory cell coupled between the selected row line and a selected one of the column lines; a leakage current detection circuit coupled to the plurality of column lines except the selected column line and adapted to detect leakage currents during said programming operation; and a current limit generation circuit adapted to generate a current limit based on the sum of the leakage currents and on a reference current, and to supply said current limit to the current supply circuit to limit said programming current.

According to one embodiment, the current limit generation circuit is adapted to generate the current limit by adding the sum of the leakage currents to the reference current, wherein the reference current represents the programming current to be applied to the selected memory cell.

According to one embodiment, the current supply circuit comprises a voltage regulator for controlling a first voltage level applied to the selected row line.

According to one embodiment, the voltage regulator comprises a first transistor coupled to the selected row line and having its control node coupled to the output of a comparator adapted to compare the voltage on the selected row line with a reference voltage at the first voltage level.

According to one embodiment, the current supply circuit comprises a current mirror having a reference branch coupled to receive the current limit and a further branch coupled to the selected row line.

According to one embodiment, the current supply circuit comprises a further comparator adapted to compare a first voltage level generated based on the current limit with a second voltage level generated based on the programming current, and to control the programming current based on said comparison.

According to one embodiment, the leakage current detection circuit comprises a voltage regulator for controlling a second voltage level applied to the column lines except the selected column line.

According to one embodiment, the current limit generation circuit comprises: a first current mirror having a reference branch coupled to receive the sum of the leakage currents and a further branch; a second current mirror having a reference branch coupled to receive the reference current and a further branch, wherein the further branches of the first and second current mirrors are coupled to an output line of the current limit generation circuit providing the current limit.

According to one embodiment, the memory device comprises: one or more further current supply circuits adapted to supply a programming current to one or more further selected row lines during the programming operation to change the resistive state of one or more of the memory cells coupled to the selected column line; and a division circuit adapted to divide the sum of the leakage currents by the number of current supply circuits.

According to one embodiment, the non-volatile programmable resistive element is one of: an OxRAM (Oxide Random Access Memory) device; a PCM (Phase Change memory) device; and an MRAM (magnetic RAM) device.

According to one embodiment, each memory cell further comprises a two-way selection device coupled in series with the non-volatile programmable resistive element and adapted to conduct above a threshold voltage.

According to a further aspect, there is provided a method of limiting a programming current in a cross-point non-volatile memory array comprising a plurality of row lines, a plurality of column lines and a plurality of memory cells arranged in rows and columns, each memory cell comprising a non-volatile programmable resistive element coupled between a corresponding one of the row lines and a corresponding one of the column lines, the method comprising: supplying, by a current supply circuit, a programming current to a selected one of the row lines during a programming operation to change the resistive state of a selected memory cell coupled between the selected row line and a selected one of the column lines; detecting, by a leakage current detection circuit coupled to the plurality of column lines except the selected column line, leakage currents during said programming operation; generating, by a current limit generation circuit, a current limit based on the sum of the leakage currents and on a reference current; and supplying said current limit to the current supply circuit to limit said programming current.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 1A schematically illustrates a cross-point memory array according to an example embodiment;

FIG. 1B schematically illustrates a non-volatile memory cell of the array of FIG. 1A in more detail according to an example embodiment;

FIG. 2 is a graph representing a current-voltage relationship across the memory cell of FIG. 1B according to an example embodiment;

FIG. 3 schematically illustrates a memory device with current limiting circuit according to an example embodiment of the present disclosure;

DETAILED DESCRIPTION

Figure 4:
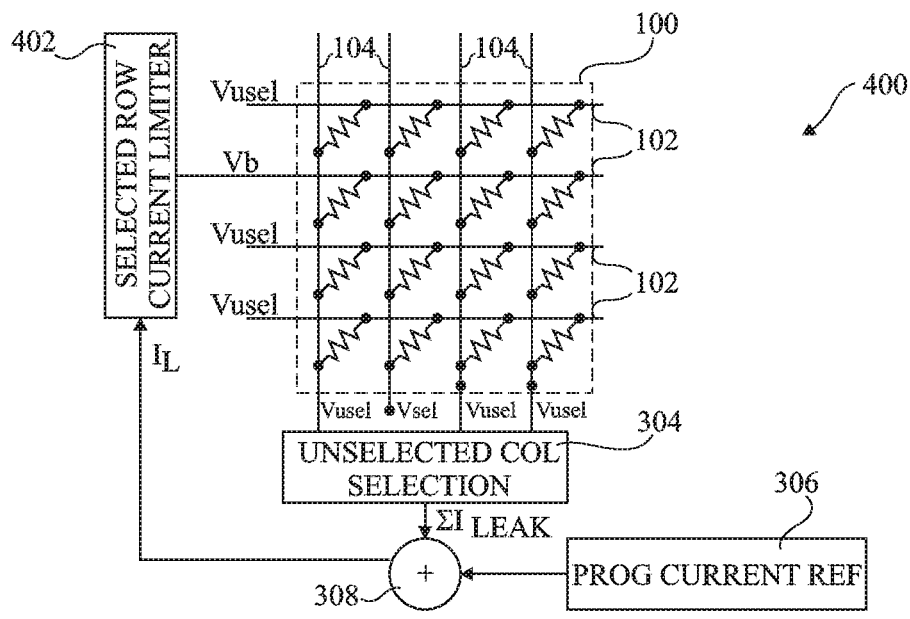
FIG. 4 schematically illustrates a memory device with current limiting circuit according to a further example embodiment of the present disclosure.

Throughout the present description, the term "connected" is used to designate a direct electrical connection between two elements, whereas the term "coupled" is used to designate an electrical connection between two elements that may be direct, or may be via one or more other components such as resistors, capacitors or transistors. Furthermore, as used herein, the term "around" is used to designate a range of ±10% of the value in question.

As used herein, the term "column line" is used to designate the lines of a memory array drawn vertically in the figures, whereas the term "row line" is used to designate the lines of the memory array drawn horizontally in the figures. It will be apparent to those skilled in the art that in practise the row lines and column lines could have any orientation.

FIG. 1A schematically illustrates an example of a cross-point memory array 100 according to an example embodiment. As illustrated, the array 100 for example comprises row lines 102 and column lines 104. In the example of FIG. 1A, the array comprises four row lines and four column lines, although in alternative embodiments there could be any number n of row lines and any number m of column lines, where n and m are each for example integers equal to two or more.

The memory array 100 comprises memory cells 106 arranged in rows and columns, one row of memory cells for each row line, and one column of memory cells for each column line. Each memory cell is coupled between a corresponding row line 102 and a corresponding column line 104. For example, the memory cells in a left-hand column of the array all have one terminal coupled to the left-hand column line 104, and their other terminal coupled to the corresponding row lines 102.

A memory cell of the array can be selected during a read or write operation by applying appropriate voltages to row lines and column lines in order to drive a current though the selected memory cell. An example is shown in FIG. 1A in which, during a write operation, a memory cell at the top left corner of the array is selected by applying a selection voltage Vsel to the top row line 102 and a low voltage Vb to the left-hand column line 104. Thus the top left memory cell of the array has a voltage of Vsel-Vb across it. For example, Vsel is at around the supply voltage VDDH of the circuit, which is for example in the range 1 to 3 V, and Vb is at or around 0 V. For example, a current applied to a selected memory cell from the row line to the column line causes the programmable resistive element to switch from a high resistance state to a low resistance state. To program the resistive element to have a different resistance state, a current is for example applied from the column line to the row line of the memory cell, or a different level of current is applied.

The other row lines 102 have a voltage Vx applied to them, and the other column lines have a voltage Vsel-Vx applied to them. The memory cells 106 for example each comprise a two-way selection device, described in more detail below, which is a non-linear device associated with a threshold level Vt. The threshold voltage Vt is for example less than Vx. When the voltage across the selection device is higher than the threshold level Vt, the selection device provides a relatively low resistance path, allowing a relatively high current to pass through it. When the voltage across the selection device is below the threshold voltage Vt, the selection device provides a relatively high resistance path, such that the current passing through it is relatively low, this current corresponding to a leakage current. The sum of these leakage currents through multiple sneak paths in the array, corresponding to the unselected memory cells, may be significant, which is why it is desirable to provide compensation for these leakage currents.

The level of Vx is chosen to be between Vb and Vsel. For example, Vx is equal to between Vsel/2 and Vsel/3. In the case that Vx=Vsel/2 and Vb=0V, the voltage across the memory cells in the left-hand column of the array and in the top row of the array will be Vsel/2, and the voltage across all of the other memory cells in the array will be 0 V. In the case that Vx=Vsel/3 and Vb=0V, the voltage across all of the memory cells in the array, apart from the memory array in the top left corner, will be Vsel/3. The level of the voltage Vx is for example chosen to minimize the leakage current in the array, and generally for most array sizes a level of Vsel/2 works well.

Most of the current resulting from the Vsel and Vb voltage levels will pass through the selected memory cell. However, as mentioned above, some of the current will be lost due to current leakage via the sneak paths in the memory cells passing through other non-selected memory cells. For example, when the voltage Vsel is applied to the top row line 102 of the array, a programming current IP will flow through the top left memory cell, and leakage currents I11, I12 and I13 may flow through the other memory cells in the top row of the array, depending on the voltage level Vsel-Vx. These leakage currents will reduce the programming current IP flowing through the selected memory cell.

FIG. 1B illustrates an example of the memory cell 106 of the array of FIG. 1A according to an example embodiment. Each memory cell 106 for example comprises a programmable resistive element 108 coupled in series with a two-way selection device 110.

The programmable resistive element 108 is for example a bipolar device programmable by the polarity of the programming current driven through it. For example, the element 108 is an OxRAM (Oxide Random Access Memory) device, PCM (Phase Change Memory) device or an MRAM (magnetic RAM) device based on STT (spin-transfer torque) technology.

As mentioned above, the two-way selection device 110 is a bipolar, non-linear device, which will conduct a current in either direction when a voltage threshold Vt across it is reached. Below the threshold voltage Vt, a relatively low current is for example conducted by the device 110. Thus the selection device for example behaves like a bi-directional diode. For example, as known to those skilled in the art, such a bi-directional selection device can be formed by, among others: a device based on a tunnel barrier; a MIM (metal-insulator-metal) structure based on Schottky emission; or a device based on joule heating induced bidirectional threshold switching. For example, such devices are discussed in more detail in the publication by J.Woo et al. entitled "Selector Devices for High Density Cross-point ReRAM", 14th Non-Volatile Memory Technology Symposium (NVMTS 2014) Oct. 27th-29th, 2014, Jeju, Korea, the contents of which is hereby incorporated by reference to the extent permitted by the law.

Thus when a voltage V>Vt is applied across the memory cell, the voltage drop Vr across the resistive element 108 will equal V−Vt. The threshold voltage Vt is for example chosen to be higher than Vsel/2, such that a relatively low current will be conducted by unselected memory cells in the array. In one embodiment, Vt is chosen to be in the range 0.8 to 1.5 V, and is for example equal to around 1 V. The voltage V is for example in the range 1 to 3 V and is for example equal to around 2 V, and the voltage Vr across the resistive element during a programming phase is in the range 1 to 2 V, and for example around 1.4 V.

FIG. 2 is a graph illustrating an example of the programming voltages and resulting currents in the memory cell 106 of FIG. 1B according to an example embodiment in which the resistive element 108 is implemented by an OxRAM device.

As shown by a solid curve, when the resistive element 108 is in the low resistive state, until the threshold voltage Vt or −Vt is reached, the current through the memory cell will be at a low level of Imin or less. In the example of FIG. 2, the positive and negative thresholds Vt, −Vt are of the same magnitude, but it would be possible in some embodiments for these thresholds to have different magnitudes. When the voltage is higher than Vt or lower than −Vt, the current is proportional to V−Vt. If however a negative level Voff is reached, the resistive element will switch to the high resistive state, and the current will fall to a relatively low level.

As shown by a dashed curve, when the resistive element 108 is in the high resistive state and the voltage across the memory cell goes above Vt and reaches a level Von, the current rises abruptly as the resistive element switches to the low resistive state. The current increases until a certain current limit Ilimit is reached. The level of this current limit determines the resistance of the resistive element in the low resistive state.

In the case of other types of resistive elements, the behaviour of the device when the voltage Von is reached may be different. For example, in memory cells based on MRAM technologies, the current limit does not set the resistance level of the low resistive state, but determines the retention duration. As a further example, in PCM (phase change memory) technologies, the current limit determines the volume of material that is programmed, and thus has an impact on the resistance of the device. It should be noted that PCM devices are programmed in a uni-polar fashion, meaning that it is not the direction of the programming current, but the level of the current, that determines the programmed resistance.

There is thus an interest in limiting the current, with a relatively high precision, to a desired current limit Ilimit in order to control the resistive properties of the resistive element.

FIG. 3 illustrates a memory device 300 comprising the cross-point non-volatile memory array 100 of FIG. 1A and including circuits for limiting the programming current according to an example embodiment. As mentioned in relation to FIG. 1A, while the memory array comprises only 4 rows and 4 columns of memory cells, in alternatively embodiments it could comprise any number n of rows and any number m of columns.

A selected row current limiter circuit (SELECTED ROW CURRENT LIMITER) 302 is for example coupled to the selected row line, and is adapted to apply a selected line voltage level Vsel to this row line. Furthermore, the circuit 302 is adapted to limit the current supplied to this row line. The other row lines are for example coupled to an unselected line voltage Vusel, which for example corresponds to the voltage Vx of FIG. 1A, by a row control circuit (not illustrated in the figures).

A column selection circuit (not illustrated in the figures) is for example adapted to couple a selected one of the column lines to the voltage Vb. An unselected column selection circuit (UNSELECTED COL SELECTION) 304 is for example adapted to apply the unselected line voltage Vusel to each of the unselected column lines. Thus in the example of FIG. 3, a same voltage is for example applied to unselected row lines and to unselected column lines. In some embodiments, the Vb is equal to 0 V, and the voltage Vusel is equal to around Vsel/2. However, depending of the level of Vsel, the voltage Vsel/2 may not be high enough to correctly bias transistors in the circuit 304. In such a case, the voltage Vb may be chosen to be positive, for example equal to around 0.5 V, and the other voltages offset accordingly. Thus, for example, rather than being equal to Vsel/2, the voltage Vusel is for example equal to Vb+(Vsel−Vb)/2.

The circuit 304 is also for example adapted to generate a sum $\Sigma I_{LEAK}$ of the leakage currents on the unselected column lines.

In the example of FIG. 3, the memory cell second from the top and second from the left is selected.

A programming current reference circuit (PROG CURRENT REF) 306 is for example adapted to generate a reference current IREF corresponding to a desired programming current limit Ilimit of the memory cell to be programmed. An adder 308 is for example adapted to add the reference current IREF to the sum $\Sigma I_{LEAK}$ of the leakage currents in order to generate a current limit IL. This current limit IL is provided to the selected row current limiter circuit 302, and used by this circuit to limit the current to the selected row line.

In some embodiments, the programmable resistive element of each memory cell is an element, such as an OxRAM element, having a low resistance state that depends on the level reached by the programming current during the programming phase. In such a case, the memory device is for example capable of programming each resistive element to have one of a plurality of low resistance states, allowing more than a single bit of data to be stored by each element. This is for example achieved by setting, during each programming phase, an appropriate value of the reference current IREF among a plurality of selectable levels such that the programming current is limited to a level corresponding to desired low resistance state. For example, in one embodiment there are three distinct programming currents for programming three distinct low resistance states (LRS), and one high resistance state (HRS). Thus there are a total of four distinct resistive states, allowing two bits of data to be stored by each programmable resistive element.

While in the example of FIG. 3 the current limit IL is imposed by the circuit that provides the supply voltage Vsel, in alternative embodiments, the current limit could be imposed by the circuit that provides the supply voltage Vb, as will now be described with reference to FIG. 4.

FIG. 4 schematically illustrates a non-volatile memory circuit 400 according to an alternative embodiment to that of FIG. 3. As illustrated, the column control circuit (not illustrated in the figures) is adapted to couple a selected column line to the voltage Vsel rather than to the voltage Vb. Furthermore, the circuit 302 is replaced by a selected row current limiter circuit 402 adapted to apply a voltage of Vb to the selected row line, and to limit the current to a value IL in a similar manner to the circuit 302.

Figure 5:
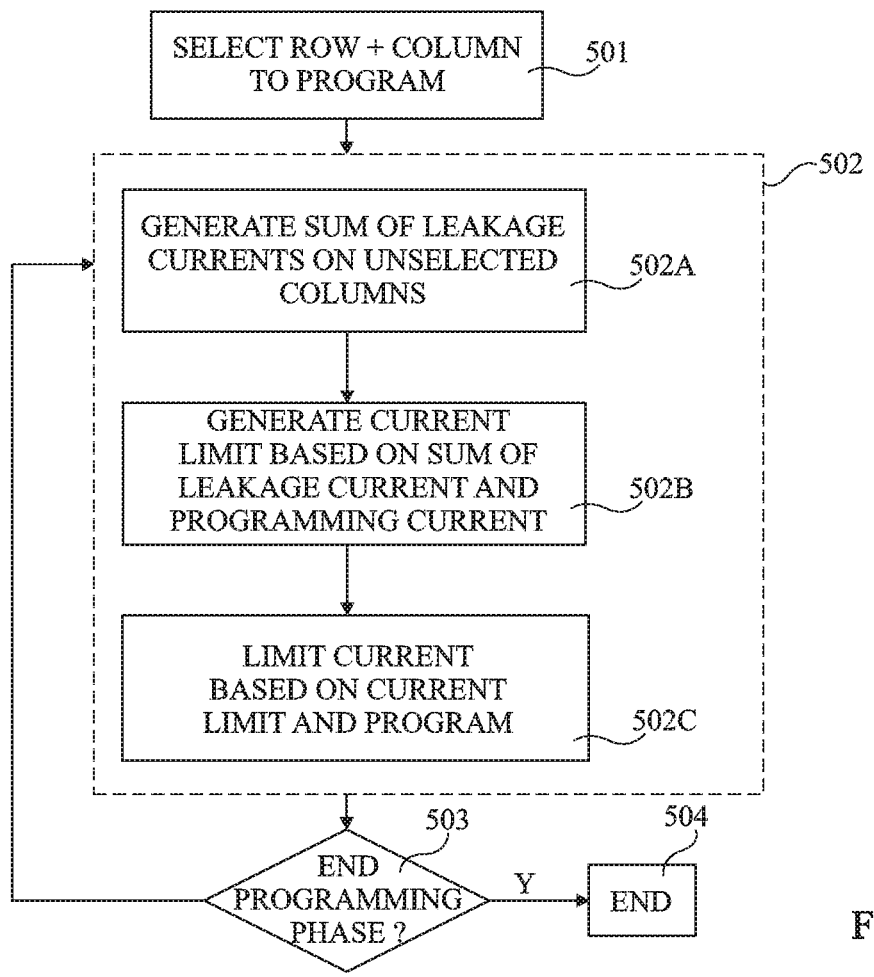
FIG. 5 is a flow diagram illustrating operations in a method of limiting a programming current in a non-volatile memory cell according to an example embodiment of the present disclosure.

FIG. 5 is a flow diagram illustrating operations in a method of limiting the programming current in a cross-point non-volatile memory array, such as the array 100 of FIG. 1A.

In an operation 501, a row line and a column line of a memory cell to be programmed are selected. For example, the selected row line is coupled to the voltage level Vsel, and the selected column line is coupled to the voltage Vb, or vice versa. This triggers the start of the programming phase.

In a subsequent operation 502, the current supplied to the selected row line is limited based on a current limit IL. In particular, the operation 502 for example comprises the following sub-operations 502A to 502C, which are all for example performed continuously during the programming phase of the memory cell.

In operation 502A, the leakage current on unselected column lines during the programming phase is detected and summed to generate the sum $\Sigma I_{LEAK}$. The sum $\Sigma I_{LEAK}$ is for example represented by a current level, although in alternative embodiments it could be represented by a voltage level.

In operation 502B, the current limit IL is generated based on the sum of the leakage currents and the reference programming current IREF. Again, the current limit IL is for example represented by a current level, although in alternative embodiments it could be represented by a voltage level.

In operation 502C, the current supplied to the selected row line during the programming phase is limited based on the current limit.

After operation 502, an operation 503 is performed, during which it is determined whether the end of the programming phase has been reached. For example, in some embodiments, this involves determining whether the current limit IL has been reached, and if so, the voltage Vsel is no longer applied to the selected row or column line, thereby ending the programming phase. Alternatively, the programming phase always continues for a certain period. If the programming phase has not yet ended, the operation 502 continues. Once the end of the programming phase has been reached, the method ends at operation 504.

Figure 6:
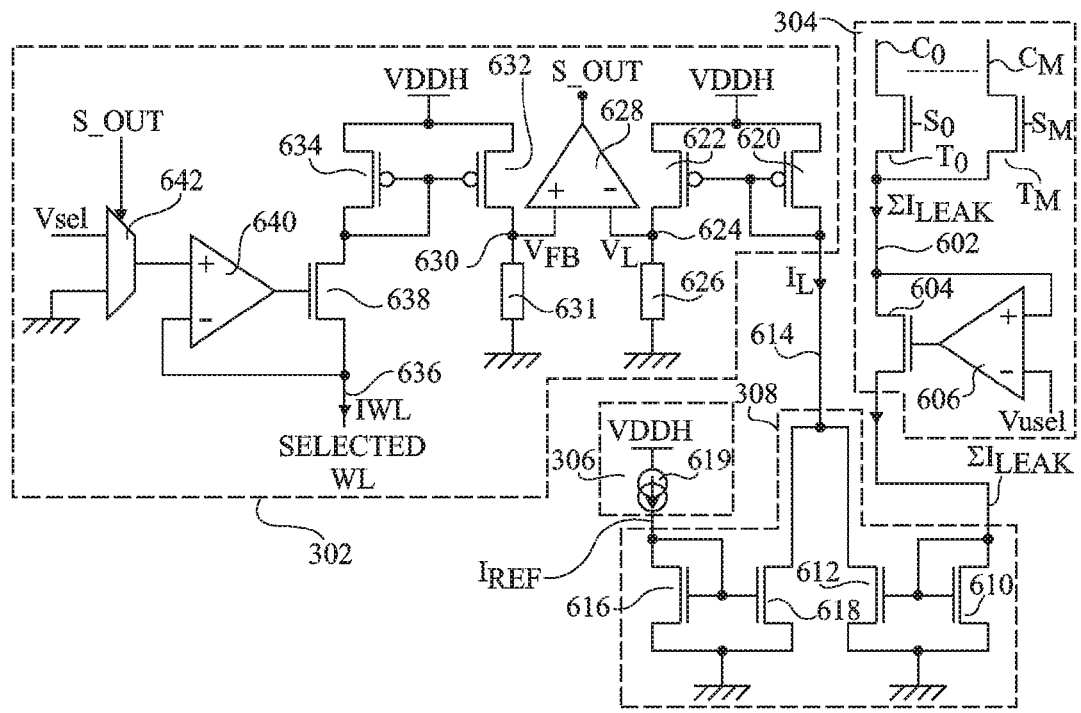
FIG. 6 schematically illustrates the memory device of FIG. 3 in more detail according to an example embodiment.

FIG. 6 schematically illustrates the memory device 300 of FIG. 3 in more detail according to an example embodiment. It will be apparent to those skilled in the art how the implementation of FIG. 6 could be adapted to implement the memory device 400 of FIG. 4.

The unselected column selection circuit 304 for example comprises a line 602 coupled to each of the unselected column lines. For example, the line 602 is coupled to each of the column lines, labelled C0 to CM in FIG. 6, via a corresponding selection NMOS transistor T0 to TM, controlled by a corresponding control signal S0 to SM. All of the control signals S0 to SM are for example activated during a programming phase, except the one corresponding to the selected column line. The line 602 provides the sum of the leakage currents $\Sigma I_{leak}$.

The voltage Vusel is for example applied to each of the unselected column lines among the lines C0 to CM by a voltage regulator formed by an NMOS transistor 604 having one of its main conducting nodes coupled to the line 602 and having its control node controlled by a comparator 606, which is for example implemented by an operational amplifier. The comparator 606 has one of its inputs coupled to the line 602, and its other input coupled to the voltage level Vusel, which is for example at or close to Vsel/2. The other main conducting node of the transistor 604 is coupled to an output line of the circuit 304 providing the sum $\Sigma I_{LEAK}$ of the leakage currents, and is for example coupled to the ground rail via an NMOS transistor 610.

The adder 308 is for example implemented by a pair of current mirrors. One current mirror is formed by the transistor 610, and a further NMOS transistor 612 coupled between an output line 614 of the adder and the ground rail. The control nodes of the transistors 610, 612 are coupled together and to the drain of transistor 610, such that transistor 610 forms the reference branch of the current mirror, and the transistor 612 conducts a current based on the current $\Sigma I_{LEAK}$. The other current mirror is formed by an NMOS transistor 616 coupled between the programming current reference circuit 306 and the ground rail, and an NMOS transistor 618 coupled between the line 614 and the ground rail. The circuit 306 for example comprises a current source 619 coupled between the transistor 616 and a supply voltage rail VDDH, the current source 619 providing the reference current IREF to the adder 308. The control nodes of the transistors 616, 618 are coupled together and to the drain of transistor 616, such that the transistor 616 forms the reference branch of the current mirror, and the transistor 618 conducts a current based on the reference current IREF.

In some embodiments, the transistors 612 and 618 have the same dimensions as transistors 610 and 616, such that the transistor 612 conducts the current $\Sigma I_{LEAK}$, and the transistor 618 conducts the current IREF. However, in alternative embodiments it would be possible for these transistors to be of different dimensions so that the currents IREF and $\Sigma I_{LEAK}$ are increased or decreased by a same factor.

The sum of the currents conducted by the transistors 612 and 618 provides the current limit IL on the line 614, which is provided to the selected row current limiter circuit 302.

The circuit 302 for example comprises a first current mirror formed of PMOS transistors 620 and 622 each having their sources coupled to the supply voltage rail VDDH. The control nodes of the transistors 620 and 622 are coupled together and to the drain of transistor 620, such that the transistor 620 forms the reference branch of the current mirror. The drain of transistor 622 is for example coupled to a node 624, which is in turn coupled to the ground rail via a resistor 626. The node 624 provides a voltage VL based on the current IL, and is coupled to one input of a comparator 628, which is for example implemented by an operational amplifier.

The comparator 628 compares the voltage VL with a feedback voltage VFB. The feedback voltage VFB is provided by a node 630 coupled to the ground rail via a resistor 631. A current passing through the resistor 631 is provided by a current mirror formed of a PMOS transistor 632 coupled in series with the resistor 631, and a PMOS transistor 634. The transistors 632, 634 have their sources coupled to the VDDH supply rail, and their control nodes coupled together and to the drain of transistor 634, such that transistor 634 forms a reference branch of the current mirror. The drain of transistor 634 is coupled to the selected row line (SELECTED WL), labelled 636 in FIG. 6, via an NMOS transistor 638. The transistor 638 forms a voltage regulator for applying the voltage Vsel to the selected row line. For example, the control node of transistor 638 is coupled to the output of a comparator 640, which is for example implemented by an operational amplifier, and which has its negative input coupled to the selected row line 636, and its positive input coupled to the output of a multiplexer 642. One input of the multiplexer 642 receives the voltage level Vsel, and the other input of the multiplexer 642 is for example coupled to ground, or to Vusel. The multiplexer 642 is controlled by the output signal S_OUT of the comparator 628.

In operation, at the start of the programming phase of a selected memory cell, the signal S_OUT at the output of the comparator 628 is for example low, and thus controls the multiplexer 642 to supply the voltage Vsel to the comparator 640. The selected row line 638 is thus brought to the voltage Vsel, and the programming current will start to rise. During the programming phase, the circuits 304, 306 and 308 generate the current limit IL. The circuit 302 converts the current limit IL into a voltage level VL, and uses the current mirror formed by the transistors 632 and 634, and the resistor 631, to generate the feedback voltage VFB based on the level of current IWL on the selected row line 636. These voltages VFB and VL are compared by the comparator 628. When current IWL on the selected row line reaches the current limit IL, the output signal S_OUT of the comparator 628 for example goes high, causing the multiplexer 642 to couple the input of the comparator to ground or to another low level, such that the programming current is stopped or significantly reduced.

All of the transistors in the circuit of FIG. 6 are for example n-channel MOS (NMOS) or p-channel MOS (PMOS) transistors, and it will be apparent to those skilled in the art that in alternative embodiments, one or more of the PMOS transistors could be replaced by NMOS transistors, and vice versa. For example, the NMOS transistors 604 and 638 could be replaced by PMOS transistors, and in such a case, the positive and negative inputs of the corresponding comparators 606, 640 are also exchanged.

Figure 7:
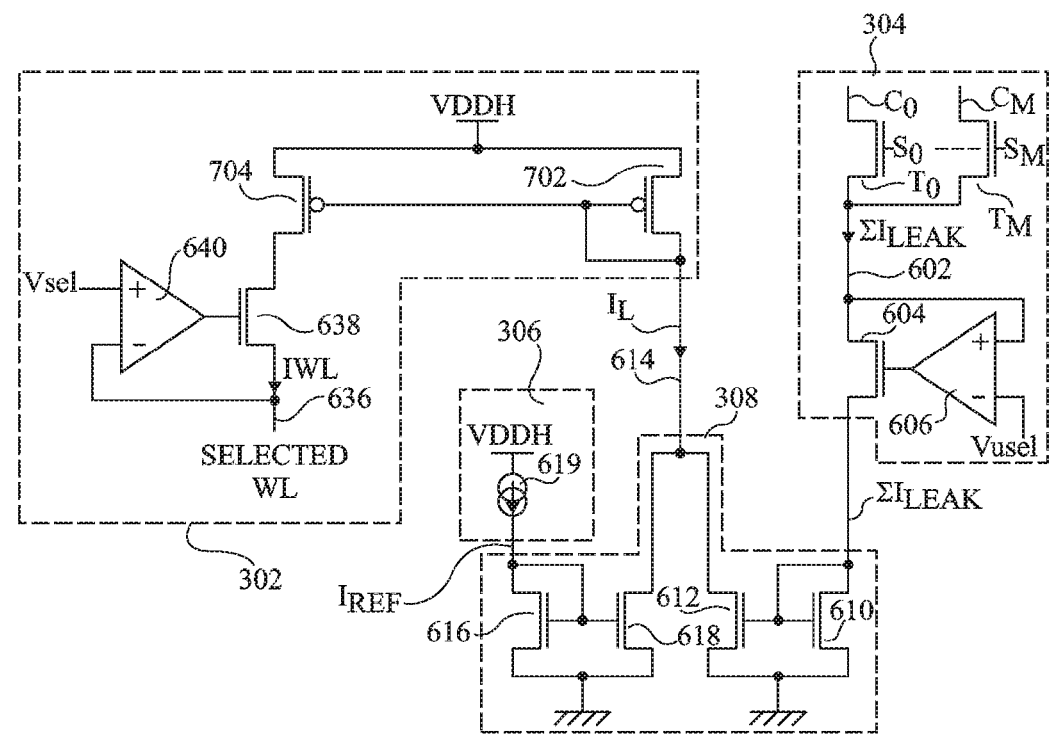
FIG. 7 schematically illustrates the memory device of FIG. 3 in more detail according to a further example embodiment.

FIG. 7 illustrates the memory device of FIG. 3 according to an alternative embodiment to that of FIG. 6. Many features in the circuit of FIG. 7 are the same as features of the circuit of FIG. 6, and these features have been labelled with like reference numerals and will not be described again in detail.

The circuits 304, 306 and 308 of FIG. 7 are for example implemented in the same fashion as in FIG. 6, and these circuits will not be described again. The circuit 302 is however modified to remove the comparator 628 and the multiplexer 642 Instead, the current limit IL is applied to the reference branch of a current mirror formed by PMOS transistors 702 and 704 having their control nodes coupled together and to the drain of transistor 702. The transistor 702 is coupled between the line 614 and the supply rail VDDH, and the transistor 704 is coupled in series with the transistor 638. The comparator 640 receives, at its negative input, the voltage level Vsel.

Thus, in the embodiment of FIG. 7, the current IWL on the selected row line 636 is directly limited by the current mirror formed by the transistors 702 and 704. In operation, at the start of the programming phase, the current IWL will be lower than the current IL, and will start to rise, but as soon as it reaches the current limit IL, it will rise no more.

There is for example no detection of the end of the write phase in the circuit of FIG. 7. Alternatively, while not shown in FIG. 7, it would be possible to couple the positive input of the comparator 640 to the output of a multiplexer 642 like in FIG. 6, with one input of the multiplexer 642 being coupled to Vsel, and the other to ground or to the voltage Vusel. In such a case, rather than being controlled by the comparator 628 (not present in FIG. 7), the multiplexer 642 could for example be controlled by an inverter having its input connected to the line 636. Before the current limit IL has been reached, the voltage on the line 636 will be relatively high, and the inverter will output a low voltage controlling the multiplexer 642 to provide the voltage Vsel to the comparator 640. However, when the current limit IL is reached, the voltage on the line 636 will fall, and the output of the inverter will go high, controlling the multiplexer 642 to provide the ground voltage or another low voltage to the comparator 640.

In the embodiments of FIGS. 3 and 4, a single memory cell of the array is selected and programmed during each programming phase. In alternative embodiments, more than one memory cell in a given column could be selected and programmed at the same time, as will now be described with reference to FIG. 8.

Figure 8:
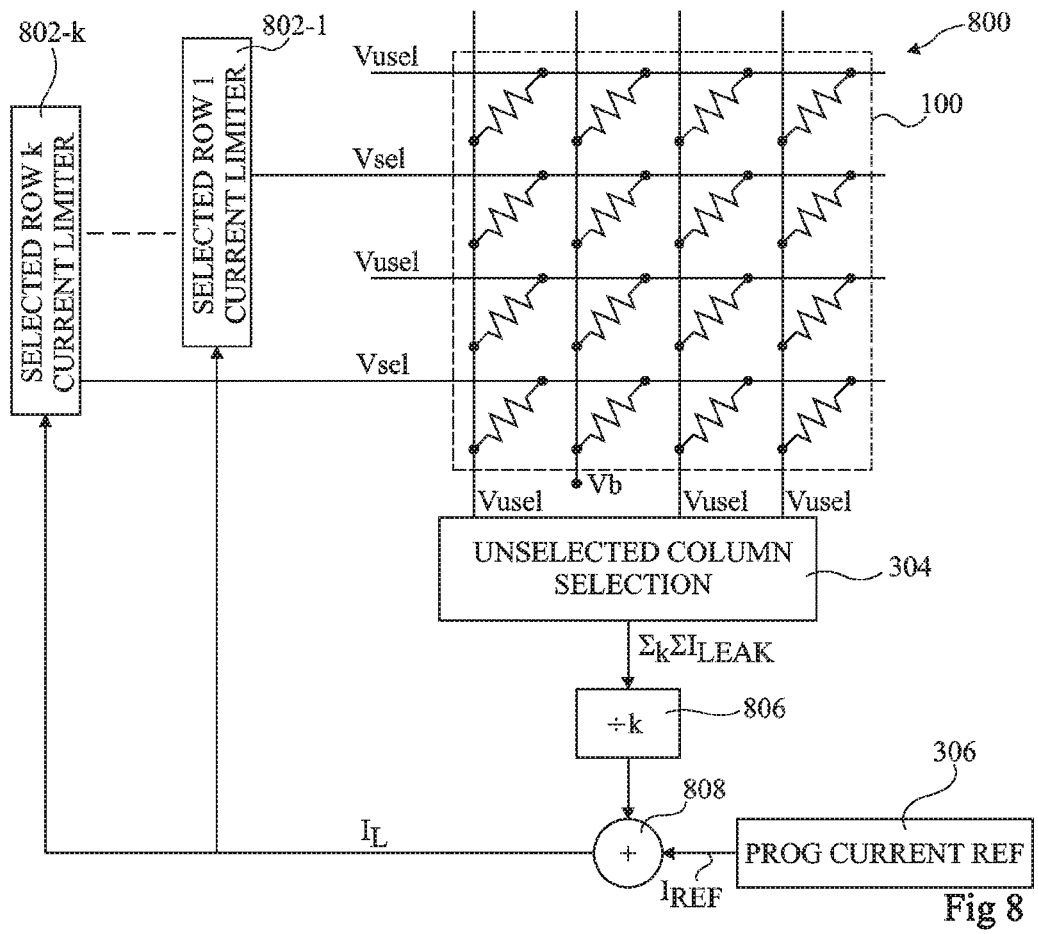
FIG. 8 schematically illustrates a memory device with a current limiting circuit according to a further example embodiment in which more than one memory cell can be programmed at once.

FIG. 8 schematically illustrates a memory device 800 according to a further example embodiment, comprising the same memory array 100 of FIG. 1.

The memory device 800 comprises a first selected row current limiter circuit (SELECTED ROW 1 CURRENT LIMITER) 804-1 coupled to a first selected row 1 of the memory array. The memory device also comprises one or more further current limiter circuits, up to a kth circuit (SELECTED ROW k CURRENT LIMITER) 804-$k$, respectively coupled to one or more further selected rows of the memory array.

A single selected column line is for example coupled to the voltage Vb, and the other column lines are coupled to the unselected column selection circuit 304. Because more than one of the rows receives a programming current, the output of the circuit 304 is a current $\Sigma_k \Sigma I_{LEAK}$ equal to the sum of leakage currents generated by the k programming currents. This current is for example provided to a circuit 806, which divides the current by k, in order to generate an average leakage current per selected row. The result of the division is for example provided to an adder 808, which adds it to the reference current IREF provided by the circuit 306, and outputs a current limit IL, which is provided to each of the circuits 804-1 to 804-$k$.

Of course, in alternative embodiments, the circuits 804-1 to 804-$k$ could provide the voltage Vb to selected row lines rather than the voltage Vsel, and a column selection circuit (not illustrated in FIG. 8) could apply the voltage Vb to the selected column line.

Figure 9:
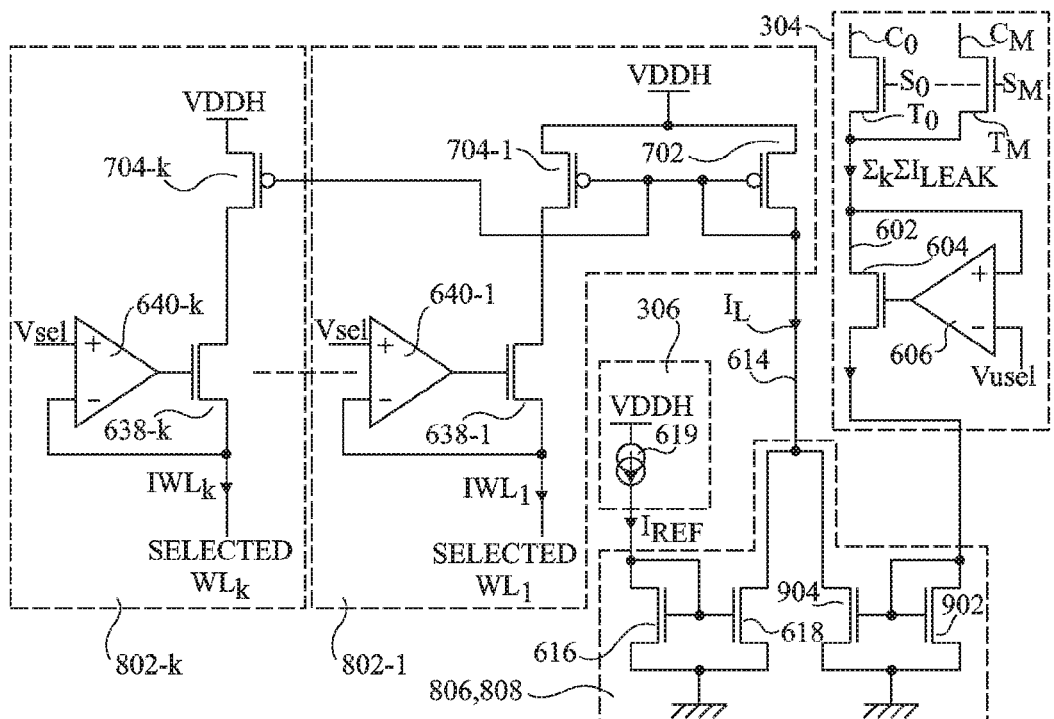
FIG. 9 schematically illustrates the memory device of FIG. 8 in more detail according to an example embodiment.

FIG. 9 schematically illustrates the memory device 800 of FIG. 8 in more detail according to an example embodiment.

The circuits 304 and 306 are for example the same as those circuits in FIG. 6, and will not be described again in detail.

The circuits 806 and 808 for dividing the current $\Sigma_k \Sigma I_{LEAK}$ by k and adding the result to the current IREF are for example implemented by a circuit similar to the circuit of the adder 308 of FIG. 6. However, the transistors 610 and 612 of the current mirror receiving the current $\Sigma I_{LEAK}$ are replaced by transistors 902 and 904 respectively. The widths of the transistors 902 and 904 are for example different in order to implement the division function of the circuit 806. For example, calling the width of transistor 902 W, the width of transistor 904 is for example W/k.

The current limiting circuits 804-1 to 804-$k$ are each for example implemented by a circuit similar to the circuit 302 of FIG. 7, except that the transistor 702 is for example implemented in only one of these circuits, for example in the circuit 804-1, and each of the circuits 804-1 to 804-$k$ comprises the transistor 704-1 to 704-$k$ respectively having its gate coupled to the line 614 in order to limit the current on the corresponding selected row line to the level IL. Each of the circuits 804-1 to 804-$k$ comprises a corresponding transistor 638-1 to 638-$k$ and corresponding multiplexer 640-1 to 640-$k$ coupled to the corresponding selected row line IWL1 to IWLk.

An advantage of the embodiments described herein is that leakage currents in a cross-point memory array can be compensated in a simple and precise fashion.

Having thus described at least one illustrative embodiment, various alterations, modifications and improvements will readily occur to those skilled in the art. For example, it will be apparent to those skilled in the art that while circuit comprising MOS transistors have been described, in alternative implementations, different transistor technologies could be used, such as bi-polar technology.

Furthermore, it will be apparent to those skilled in the art that the level of the supply voltage VDDH will depend on the particular technology used for the resistive element, and that rather that coupling the circuits to a ground voltage, they could be coupled to a different voltage level, which could be negative.

What is claimed:

1. A memory device comprising:
a cross-point memory array comprising a plurality of row lines, a plurality of column lines and a plurality of memory cells arranged in rows and columns, each memory cell comprising a non-volatile programmable resistive element coupled between a corresponding one of the row lines and a corresponding one of the column lines;
a current supply circuit adapted to supply a programming current to a selected one of the row lines during a programming operation to change the resistive state of a selected memory cell coupled between the selected row line and a selected one of the column lines;
a leakage current detection circuit coupled to the plurality of column lines except the selected column line and adapted to detect leakage currents during said programming operation; and
a current limit generation circuit adapted to generate a current limit based on the sum of the leakage currents and on a reference current, and to supply said current limit to the current supply circuit to limit said programming current.

2. The memory device of claim 1, wherein the current limit generation circuit is adapted to generate the current limit by adding the sum of the leakage currents to the reference current, wherein the reference current represents the programming current to be applied to the selected memory cell.

3. The memory device of claim 1, wherein the current supply circuit comprises a voltage regulator for controlling a first voltage level applied to the selected row line.

4. The memory device of claim 3, wherein the voltage regulator comprises a first transistor coupled to the selected row line and having its control node coupled to the output of a comparator adapted to compare the voltage on the selected row line with a reference voltage at the first voltage level.

5. The memory device of claim 1, wherein the current supply circuit comprises a current mirror having a reference branch coupled to receive the current limit and a further branch coupled to the selected row line.

6. The memory device of claim 1, wherein the current supply circuit comprises a further comparator adapted to compare a first voltage level generated based on the current limit with a second voltage level generated based on the programming current, and to control the programming current based on said comparison.

7. The memory device of claim 1, wherein the leakage current detection circuit comprises a voltage regulator for controlling a second voltage level applied to the column lines except the selected column line.

8. The memory device of claim 1, wherein the current limit generation circuit comprises:
   a first current mirror having a reference branch coupled to receive the sum of the leakage currents and a further branch;
   a second current mirror having a reference branch coupled to receive the reference current and a further branch, wherein the further branches of the first and second current mirrors are coupled to an output line of the current limit generation circuit providing the current limit.

9. The memory device of claim 1, comprising:
   one or more further current supply circuits adapted to supply a programming current to one or more further selected row lines during the programming operation to change the resistive state of one or more of the memory cells coupled to the selected column line; and
   a division circuit adapted to divide the sum of the leakage currents by the number of current supply circuits.

10. The memory device of claim 1, wherein the non-volatile programmable resistive element is one of:
   an OxRAM device;
   a PCM device; and
   an MRAM device.

11. The memory device of claim 1, wherein each memory cell further comprises a two-way selection device coupled in series with the non-volatile programmable resistive element and adapted to conduct above a threshold voltage.

12. A method of limiting a programming current in a cross-point non-volatile memory array comprising a plurality of row lines, a plurality of column lines and a plurality of memory cells arranged in rows and columns, each memory cell comprising a non-volatile programmable resistive element coupled between a corresponding one of the row lines and a corresponding one of the column lines, the method comprising:
   supplying, by a current supply circuit, a programming current to a selected one of the row lines during a programming operation to change the resistive state of a selected memory cell coupled between the selected row line and a selected one of the column lines;
   detecting, by a leakage current detection circuit coupled to the plurality of column lines except the selected column line, leakage currents during said programming operation;
   generating, by a current limit generation circuit, a current limit based on the sum of the leakage currents and on a reference current; and
   supplying said current limit to the current supply circuit to limit said programming current.

* * * * *